United States Patent
Cok et al.

(10) Patent No.: US 6,867,549 B2
(45) Date of Patent: Mar. 15, 2005

(54) COLOR OLED DISPLAY HAVING REPEATED PATTERNS OF COLORED LIGHT EMITTING ELEMENTS

(75) Inventors: Ronald S. Cok, Rochester, NY (US);
Andrew D. Arnold, Hilton, NY (US);
Michael E. Miller, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/315,622

(22) Filed: Dec. 10, 2002

(65) Prior Publication Data

US 2004/0108818 A1 Jun. 10, 2004

(51) Int. Cl.$^7$ .................................. G09G 3/10
(52) U.S. Cl. ..................... 315/169.3; 345/589
(58) Field of Search ............ 315/169.3; 345/45, 345/55, 76, 589

(56) References Cited

U.S. PATENT DOCUMENTS

| | | | |
|---|---|---|---|
| 3,971,065 | A | 7/1976 | Bayer ........................... 358/41 |
| 5,341,153 | A | 8/1994 | Benzschawel et al. ....... 345/152 |
| 6,366,025 | B1 | 4/2002 | Yamada .................... 315/169.3 |
| 2002/0015110 | A1 | 2/2002 | Brown |
| 2002/0024618 | A1 | 2/2002 | Imai |
| 2003/0034992 | A1 * | 2/2003 | Brown et al. ................ 345/690 |
| 2003/0048239 | A1 * | 3/2003 | Cok et al. ...................... 345/55 |
| 2003/0128179 | A1 * | 7/2003 | Credelle ........................ 345/88 |
| 2003/0128225 | A1 * | 7/2003 | Credelle et al. ............. 345/694 |
| 2004/0036421 | A1 | 2/2004 | Arnold et al. ............ 315/169.3 |

FOREIGN PATENT DOCUMENTS

| | | |
|---|---|---|
| EP | 1032045 | 8/2000 |
| JP | 10/39791 | 2/1998 |
| WO | 01/99195 | 12/2001 |

OTHER PUBLICATIONS

Brown Elliott et al., "Co–Optimization of Color AMLCD Subpixel Architecture and Rendering Algorithms," *SID 02 Digest*, pp. 172–175.

* cited by examiner

*Primary Examiner*—Thuy Vinh Tran
(74) *Attorney, Agent, or Firm*—Andrew J. Anderson; Thomas H. Close

(57) ABSTRACT

An OLED display device for displaying a color image includes an array of different colored independently controllable light emitting elements arranged in repeated patterns, a number of light emitting elements of at least one color in each pattern being different than a number of light emitting elements of a different color and the different number of light emitting elements of the different colors being a function of a relative human visual frequency response to the colors, and a relative size of light emitting elements of different colors being a function of a lifetime of the light emitting elements, an efficiency of the light emitting elements, and the number of light emitting elements of the different colors in the pattern, wherein at least one of the lifetime, and the efficiency is different for different colors.

25 Claims, 4 Drawing Sheets

COLOR OLED DISPLAY HAVING REPEATED PATTERNS OF COLORED LIGHT EMITTING ELEMENTS

FIELD OF THE INVENTION

The present invention relates to organic light emitting diode (OLED) displays, and more particularly, to OLED displays having repeated patterns of colored light emitting elements.

BACKGROUND OF THE INVENTION

Organic light-emitting diode (OLED) display devices utilize a current passed through thin-film layers of organic materials to generate light. Electrodes located on either side of the organic layers provide current to the organic layers. The color of the light emitted by a light emitting element depends on the specific organic material used to make the OLED. Alternatively, color display devices can be made using the organic materials that emit white light and an array of color filters (CFAs) is located over the array of light emitting elements.

It has been known for many years that the human eye is most sensitive to green light and less sensitive to red and blue light. More specifically, the spatial resolution of the human visual system is driven primarily by the luminance rather than the chrominance of a signal. Since green light provides the preponderance of luminance information in typical viewing environments the spatial resolution of the visual system during normal daylight viewing conditions is highest for green light, lower for red light, and even lower for blue light when viewing images generated by a typical color balanced image capture and display system. This fact has been used in a variety of ways to optimize the frequency response of imaging systems. For example, signals carrying color image information are sometimes designed with a luminance or green signal at one resolution and two color-difference signals at a lower resolution.

U.S. patent application Ser. No. 2002/0015110 by Brown Elliott, published Feb. 7, 2002, shows an arrangement of color pixels for a full color imaging device that takes into account the spatial response of the human visual system to different colors of light. Referring to FIG. 2, one example proposed by Brown Elliot includes a repeating rectangular pattern 10 of red 12 green 14 and blue 16 rectangular light emitting elements wherein pairs of red and green light emitting elements occupy diagonal corners and a blue light emitting element is located in the middle of the pattern.

It is known that the efficiency of light production by various OLED light emitters of different colors varies. OLED display devices also suffer from color-dependent age-related degradation in luminous efficiency. As the devices are used, the energy required to produce the various colors in the devices increases at different rates. This aging is dependent on the current density used to drive the organic materials. A larger current density causes faster aging; a smaller current density causes slower aging. Thus, over time, as OLED display devices are used at a constant current level, the displays grow dimmer and the white color produced by driving a combination of red, green and blue colored light emitting elements changes.

It has been proposed to adjust the relative sizes of the different colored light emitting elements to compensate for color-dependent age-related degradation in luminous efficiency. The development of OLED displays with different sizes of red, green, and blue light emitting elements is disclosed in U.S. Pat. No. 6,366,025, issued Apr. 2, 2002 to Yamada. Yamada discloses an OLED display with unequal light emitting element areas, wherein the area of the light emitting elements are adjusted with the goal of improving the lifetime of the OLED display. While Yamada discloses light emitting elements having different sizes for optimizing the lifetime of the display, the display is not optimized with respect to the response of the human visual system.

There is a need therefore for an improved OLED display that simultaneously optimizes the resolution and lifetime in an OLED display device.

SUMMARY OF THE INVENTION

The need is met by providing an OLED display device for displaying a color image that includes an array of different colored independently controllable light emitting elements arranged in repeated patterns, a number of light emitting elements of at least one color in each pattern being different than a number of light emitting elements of a different color and the different number of light emitting elements of the different colors being a function of a relative human visual frequency response to the colors, and a relative size of light emitting elements of different colors being a function of a lifetime of the light emitting elements, an efficiency of the light emitting elements, and the number of light emitting elements of the different colors in the pattern, wherein at least one of the lifetime, and the efficiency is different for different colors.

Advantages

The present invention has the advantage that it simultaneously increases the lifetime, power efficiency, and apparent resolution of an OLED display device.

DETAILED DESCRIPTION OF THE INVENTION

The present invention is useful for both top-emitting OLED display devices (those that emit light through a cover placed above a substrate on which the OLED is constructed) and bottom-emitting OLED display devices (those that emit light through the substrate on which the OLED is constructed). It is also useful for passive-matrix or active-matrix devices.

Figure 2:
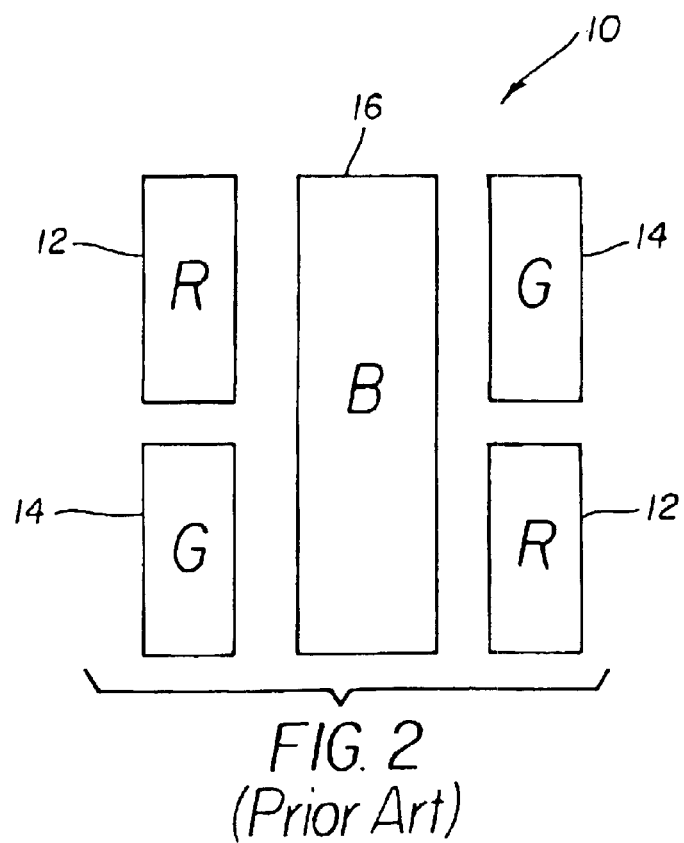
FIG. 2 is a schematic diagram illustrating a pattern of light emitting elements according to the prior art.

Referring to FIG. 2, as suggested by the prior art, a color pixel 10 in an OLED device may have a pattern that includes a greater number of green light emitting elements 14 than red 12 or blue 16 light emitting elements. These pixel patterns are repeated within the OLED display device. Since the human visual frequency response is more sensitive to green and less sensitive to red and blue, a display will appear to have a resolution equal to the frequency of green light emitting elements. Thus by providing more green light emitting elements in the patterns, the apparent resolution of the display can be improved.

This approach, however, is not completely satisfactory. Because the differently-colored light emitting elements age at different rates and become less efficient over time, a white color produced by combining red, green, and blue light from red green and blue light emitting elements will change in color and the colors themselves will fade over time.

The efficiency with which the differently colored light emitting elements produce light also varies. Light emitting elements made with higher efficiency materials can be made smaller than light emitting elements made with lower efficiency materials while producing the same light output. The efficiency of the materials is determined by its light output at a given power usage.

Furthermore, displays are designed to have a white point that is produced by a specific ratio of different colored light from the light emitting elements. If the spatial frequency response, efficiencies and aging of all the differently colored light emitting elements were the same, a display with a specific white point could be optimized by providing differently colored light emitting elements whose relative sizes corresponded to the ratio of red green and blue light to form the designed white point.

According to the present invention an OLED display is optimized with respect to the human visual system frequency response to different colors, the relative light-producing efficiency of the various light emitting elements within a pixel, and the relative aging characteristics of the various light emitting elements within a pixel. Optionally, a designed white point of the display can also be taken into account.

If the relative efficiency of a first light emitting element with respect to a second is denoted as E where E is the relative amount of light produced at a given power provided to the first and second light emitting elements, the relative rate of aging to a given minimum threshold of the first light emitting element with respect to the second is denoted A, and the relative number of the first element with respect to the second element in a pattern is denoted F, then we can express the relative size S of the first element with respect to the second element as:

$$S = \frac{A}{E \times F} \quad (1)$$

The size of one of the light emitting elements can be arbitrarily selected and the size of the other light emitting elements determined in relationship to it according to equation (1). For example, for a pattern having red, green and blue light emitting elements, with two green elements, one red light emitting element, and one blue light emitting element, the green element can be selected first, then the sizes of the red and blue elements can be calculated according to equation (1) using F=½ The differently sized light emitting elements are then arranged in a specified pattern to define a pixel, and the pattern is then scaled in size to provide a desired overall pixel size. In displays according to the present invention, F and at least one of A, or E is different for differently colored light emitting elements. A and E are measured values, F is selected consistent with a model of the color dependent frequency response of the human visual system, and W is chosen to suit the desired application.

Figure 1:
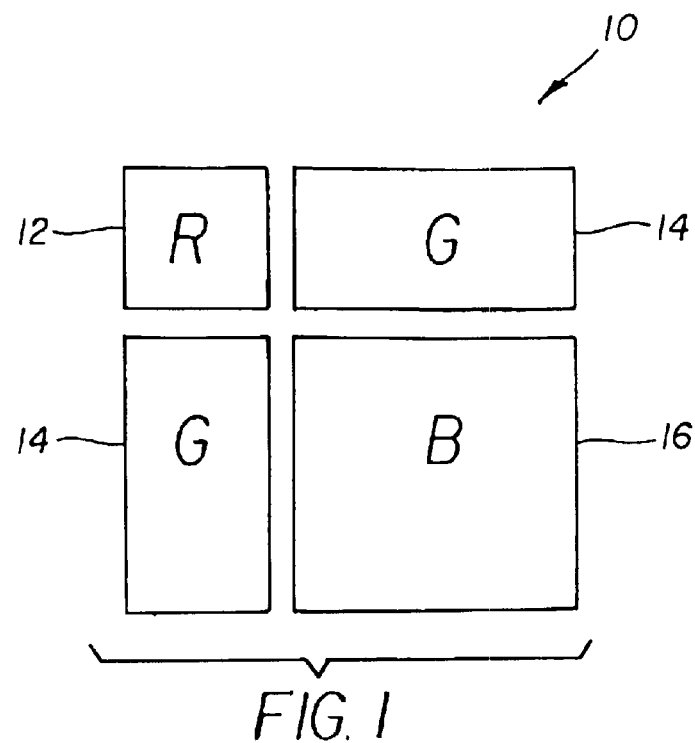
FIG. 1 is a schematic diagram illustrating a pattern of light emitting elements according to one embodiment of the present invention.

Referring to FIG. 1, a pixel pattern 10 in an OLED display device according to one embodiment of the present invention includes two green light emitting elements 14 having a first size (area), a red light emitting element 12 having a second smaller size, and a blue light emitting element 16 having a larger size. The relative sizes of the pixel elements are determined as described above with respect to equation (1).

Figure 3:
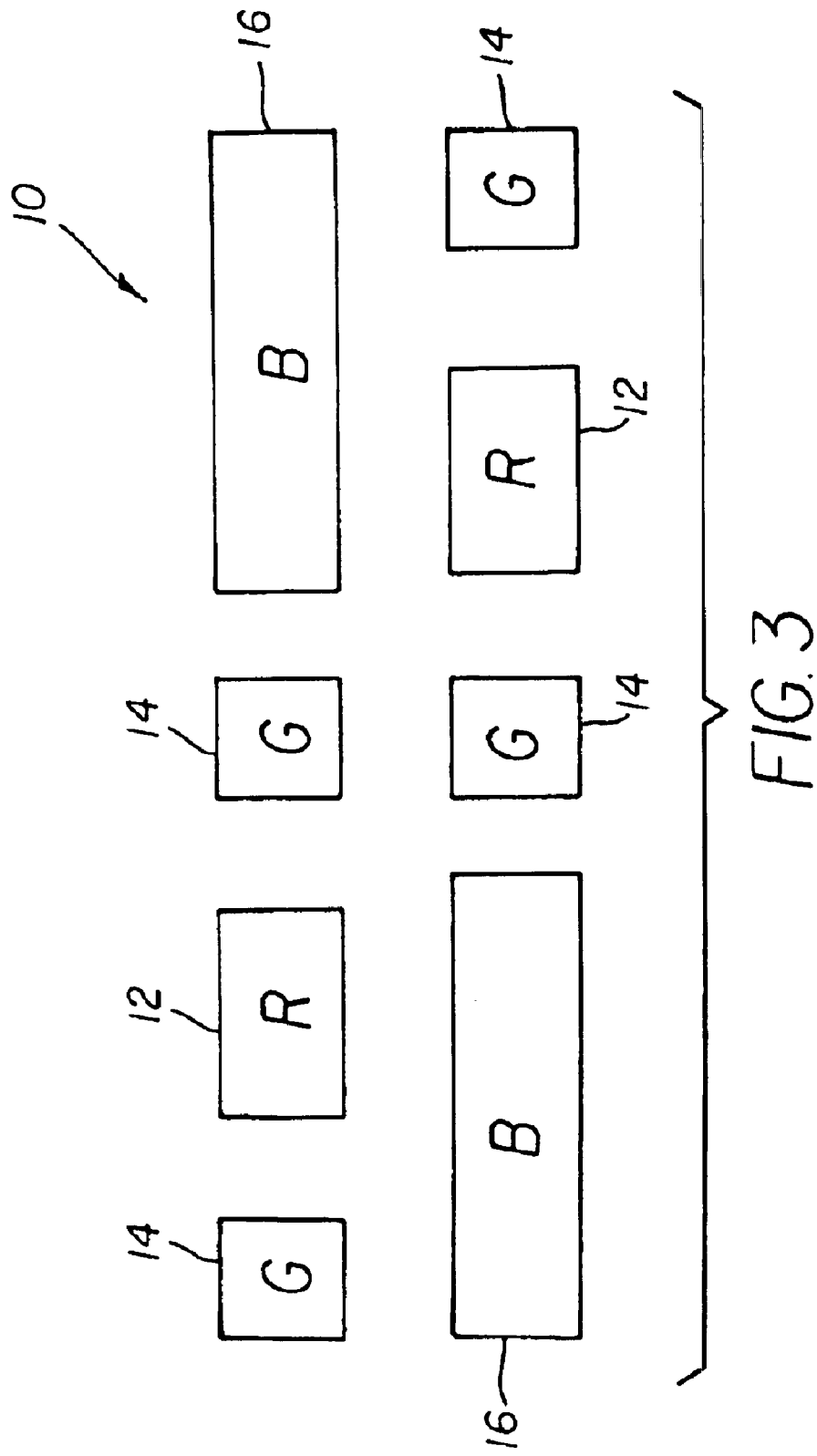
FIG. 3 is a schematic diagram illustrating a pattern of light emitting elements according to an alternative embodiment of the present invention.

Different materials may produce different relative sizes of pixel elements 12, 14, and 16. For example, for some combinations of materials, the green light emitting elements may be smaller than both the red and blue light emitting elements. Moreover, while the embodiment of FIG. 1 illustrates a square pixel arrangement, other arrangements are possible, for example rectangles having a sequence of green, red, green blue light emitting elements, as shown in FIG. 3. Also, as shown in FIG. 3, successive sequences in a direction perpendicular to the sequence can be offset from each other or can be aligned with each other to form stripes of a single color. The sequences can be arranged in rows, as shown in FIG. 3, or in columns.

In operation, over time, the light emitting pixel elements in the display age. Since the relative sizes of the light emitting elements are proportional to the rate at which their materials age and to their relative efficiencies, the light emitting elements will age at approximately the same rate, thus improving the lifetime of the device. Additionally, since the relative spatial frequencies of the light emitting elements occur in proportion to the human visual response for different colors, the apparent spatial resolution of the display device is improved while improving the lifetime of the display. Because the differently colored light emitting elements age at approximately the same rate, the color shift experienced by prior-art OLED display devices will not occur in OLED display devices of the present invention.

Optionally, a designed white point of the display can be taken into account when determining relative sizes of the differently colored light emitting elements. In this event, equation (1) becomes:

$$S = \frac{A \times W}{E \times F}, \quad (2)$$

where W is the relative contribution of a color of emitted light to the white point.

If the usage pattern of a display device is known beforehand, and is known to predominately display a particular color, the predetermined usage pattern may also be used to adjust the relative sizes of the differently colored light emitting elements in the display. This can be done by multiplying the relative sizes of the light emitting elements by the predetermined relative usage of the particular color. For example, if it is known that the display will be used throughout its lifetime to display a blue background, the relative size of the blue light emitting elements can be increased. In this event, equation (2) becomes $$S = \frac{A \times W \times U}{E \times F}, \quad (3)$$

where U is the known relative usage of a color of emitted light in the display.

Figure 4:
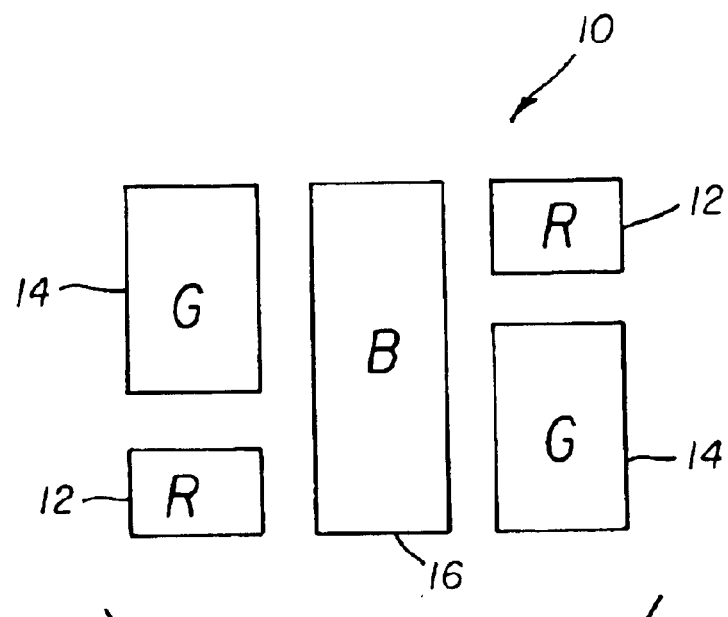
FIG. 4 is a schematic diagram illustrating a pattern of light emitting elements according to an alternative embodiment of the present invention.
Figure 5:
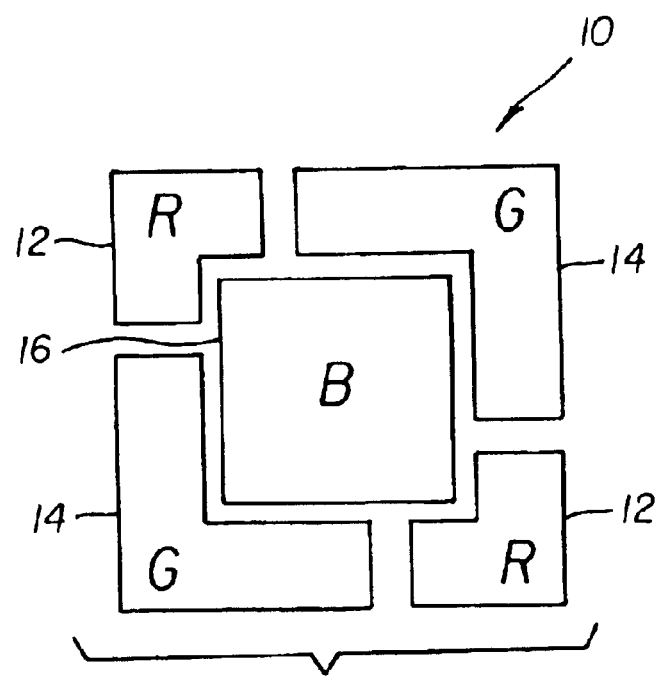
FIG. 5 is a schematic diagram illustrating a pattern of light emitting elements according to an alternative embodiment of the present invention.
Figure 6:
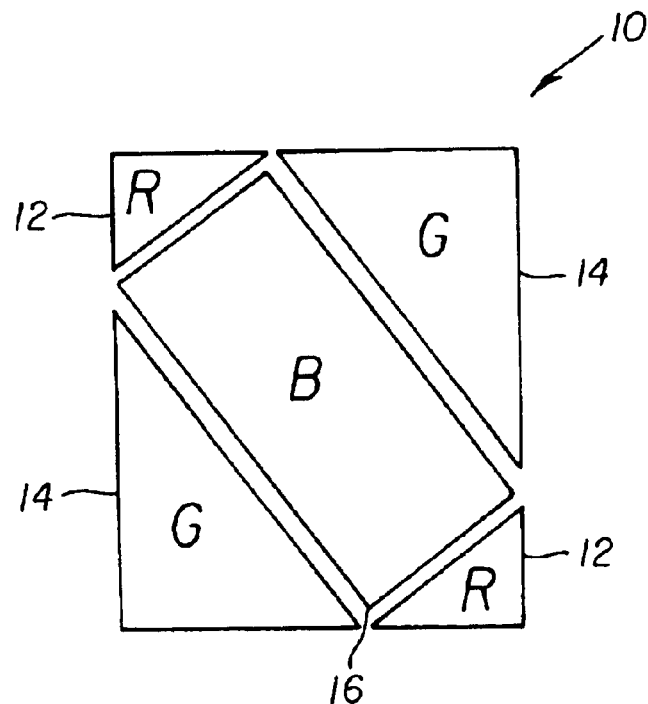
FIG. 6 is a schematic diagram illustrating a pattern of light emitting elements according to an alternative embodiment of the present invention.
Figure 7:
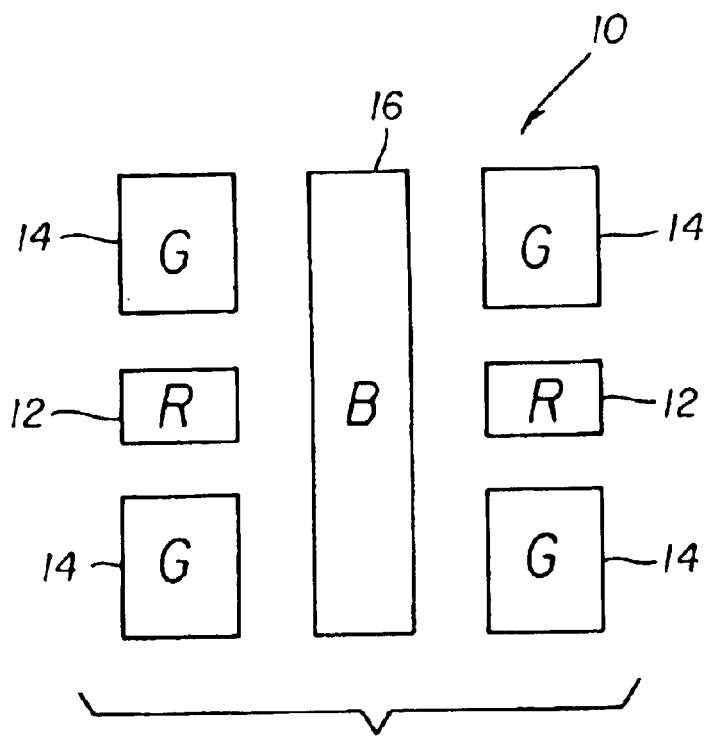
FIG. 7 is a schematic diagram illustrating a pattern of light emitting elements according to an alternative embodiment of the present invention.

Referring to FIGS. 4, 5, and 6, an alternative element arrangement for a pixel 10 in a display device according to the present invention the pixel patterns include 5 light emitting elements that define a rectangular pattern, two first color light emitting elements being located at two diagonally opposite corners of the rectangle, two second color light emitting elements being located at the other two corners, and a third color light emitting element being located in the middle of the rectangular pattern. In the embodiment shown in FIG. 4, the pattern includes one blue element 16 of a larger size and two each of smaller red 12 and green elements 14, the red elements being smaller than the green elements. Alternatively, the red elements might be smaller than the green depending on the efficiency and aging characteristics of the red and green OLED materials. Because the human visual system is least responsive to blue, the smaller number of blue elements will not significantly reduce the perceived resolution of the display. As shown in FIG. 5, the red and green light emitting elements 12 and 14 respectively may be L-shaped, and surround the larger central rectangular blue light emitting element 16. As shown in FIG. 6, the red and green light emitting elements 12 and 14 respectively may be triangular-shaped, and surround the larger central rectangular blue light emitting element 16. As shown in FIG. 7, the pixel patterns may include seven rectangular light emitting elements that define a rectangular pattern, four green light emitting elements 14 being located at four corners of the rectangle, two red light emitting elements 12 being located in the middle of opposite sides of the rectangle a larger blue light emitting element 16 being arranged in the middle of the rectangular pattern.

Color OLED displays may also be made by providing an array of white light emitting elements with color filters to provide differently colored light emitting elements. The relative sizes of the light emitting elements may be designed according to the present invention to accommodate the efficiencies of the color components of a color filter array when used in conjunction with a white OLED emitter. The white light emitting OLED material will age consistently for all of the differently colored light emitting elements if all elements are driven uniformly, but drive level will vary if the color filters that produce the colored light are not designed appropriately for the desired display white point. To compensate, the pixel size of the blue component relative to the red or green may be larger, thereby causing the pixel elements to age at a common rate.

This invention is advantageously practiced with both top-emitting and bottom-emitting OLED active matrix devices. This invention may be used in any OLED device including simple matrix or passive matrix devices.

The invention has been described in detail with particular reference to certain preferred embodiments thereof, but it will be understood that variations and modifications can be effected within the spirit and scope of the invention.

Parts List 10 color pixel
12 red light emitting element
14 green light emitting element
16 blue light emitting element

What is claimed is:

1. An OLED display device for displaying a color image, comprising an array of different colored independently controllable light emitting elements arranged in repeated patterns, a number of light emitting elements of at least one color in each pattern being different from a number of light emitting elements of a different color and the different number of light emitting elements of the different colors being a function of a relative human visual frequency response to the colors, and a relative size of light emitting elements of different colors being a function of a lifetime of the light emitting elements, an efficiency of the light emitting elements, and the number of light emitting elements of the different colors in the pattern, wherein at least one of the lifetime, and the efficiency is different for different colors such that the relative size of the light emitting elements of different colors is determined in relationship to a proportional factor A/(E.F) wherein A represents a relative rate of aging, E represents a relative amount of light produced at a given power, and F represents a relative number of the light emitting elements in each pattern.

2. The OLED display device claimed in claim 1, wherein the size of a light emitting element is a further function of a relative contribution of the color of the light emitting element to a desired white point of the display.

3. The OLED display device claimed in claim 1, wherein the repeated patterns are aligned with each other.

4. The OLED display device claimed in claim 1, wherein the repeated patterns are offset with respect to each other.

5. The OLED display device claimed in claim 1, wherein the patterns include red, green, and blue light emitting elements and there are more green light emitting elements than red or blue light emitting elements.

6. The OLED display device claimed in claim 5, wherein the blue light emitting elements are largest.

7. The OLED display device claimed in claim 5, wherein the red light emitting elements are smaller than each of the green and blue elements.

8. The OLED display device claimed in claim 5, wherein the green light emitting elements are smaller than each of the red and blue elements.

9. The OLED display device claimed in claim 1, wherein the patterns include four light emitting elements in a series having, in order, a first color light emitting element, a second color light emitting element, another first color light emitting element, and a third color light emitting element.

10. The OLED display device claimed in claim 9, wherein the first color is green, the second color is red and the third color is blue.

11. The OLED display device claimed in claim 10, wherein the blue light emitting element is largest.

12. The OLED display device claimed in claim 10, wherein the green light emitting element is smallest 13. The OLED display device claimed in claim 1, wherein the patterns include four elements that define a rectangular pattern, two first color light emitting elements being located at opposite corners of the rectangular pattern and second and third color light emitting elements being located at the remaining two corners of the rectangular pattern.

14. The OLED display device claimed in claim 13, wherein the first color is green, the second color is red and the third color is blue.

15. The OLED display device claimed in claim 14, wherein the blue light emitting element is largest.

16. The OLED display device claimed in claim 14, wherein the red light emitting element is smallest.

17. The OLED display device claimed in claim 1, wherein the patterns include five light emitting elements that define a rectangular pattern, two first color light emitting elements being located at two diagonally opposite corners of the rectangular pattern, two second color light emitting elements being located at the other two corners, and a third color light emitting element being located in the middle of the rectangular pattern.

18. The OLED display device claimed in claim 17, wherein the first color is green, the second color is red and the third color is blue.

19. The OLED display device claimed in claim 18, wherein the blue light emitting element is largest.

20. The OLED display device claimed in claim 18, wherein the red light emitting element is smaller than each of the green and blue elements.

21. The OLED display device claimed in claim 17, wherein the first color light emitting elements and the second color light emitting elements are L-shaped elements and the third color light emitting element is a rectangular element.

22. The OLED display device claimed in claim 17, wherein the first color light emitting elements and the second color light emitting elements are triangular-shaped elements and the third color light emitting element is a rectangular element.

23. The OLED display device claimed in claim 1, wherein the patterns include seven rectangular light emitting elements that define a rectangular pattern, four first color light emitting elements being located at four corners of the rectangular pattern, two second color light emitting elements being located in the middle of opposite sides of the rectangular pattern, a third color light emitting element being arranged in the middle of the rectangular pattern.

24. The OLED display device claimed in claim 1, wherein the light emitting elements comprise a white light emitting OLED material and a color filter.

25. The OLED display device claimed in claim 1, wherein the size of a light emitting element is a further function of a predetermined relative usage of a color in the display.

* * * * *